United States Patent
Lien et al.

(10) Patent No.: US 12,148,480 B2
(45) Date of Patent: Nov. 19, 2024

(54) 3D NAND MEMORY WITH FAST CORRECTIVE READ

(71) Applicant: Micron Technology, Inc., Boise, ID (US)

(72) Inventors: Yu-Chung Lien, San Jose, CA (US); Jun Wan, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 17/891,544

(22) Filed: Aug. 19, 2022

(65) Prior Publication Data

US 2024/0062832 A1 Feb. 22, 2024

(51) Int. Cl.
*G11C 16/26* (2006.01)
*G11C 16/04* (2006.01)

(52) U.S. Cl.
CPC .......... *G11C 16/26* (2013.01); *G11C 16/0483* (2013.01)

(58) Field of Classification Search
CPC ............................. G11C 16/26; G11C 16/0483
See application file for complete search history.

(56) References Cited

U.S. PATENT DOCUMENTS

2009/0273978 A1* 11/2009 Fukuda .............. G11C 16/3404
365/185.24
2013/0100754 A1* 4/2013 Asaoka .............. G11C 16/3404
365/222

* cited by examiner

*Primary Examiner* — Jay W. Radke
(74) *Attorney, Agent, or Firm* — Schwegman Lundberg & Woessner, P.A.

(57) ABSTRACT

Apparatus and methods are disclosed, including an apparatus that includes a set of memory components of a memory sub-system. The set of memory components includes a processing device that initiates a corrective read (CR) operation on a set of memory components. The set of memory components includes a pillar that includes a channel and a plurality of transistors. The processing device applies a charge to a first word line (WL) comprising a first transistor of a plurality of transistors to neutralize charges in the channel and senses a charge distribution of a second WL comprising a second transistor of the plurality of transistors adjacent to the first transistor based on the charge applied to the first WL that neutralized the charges in the channel.

20 Claims, 12 Drawing Sheets

3D NAND MEMORY WITH FAST CORRECTIVE READ

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
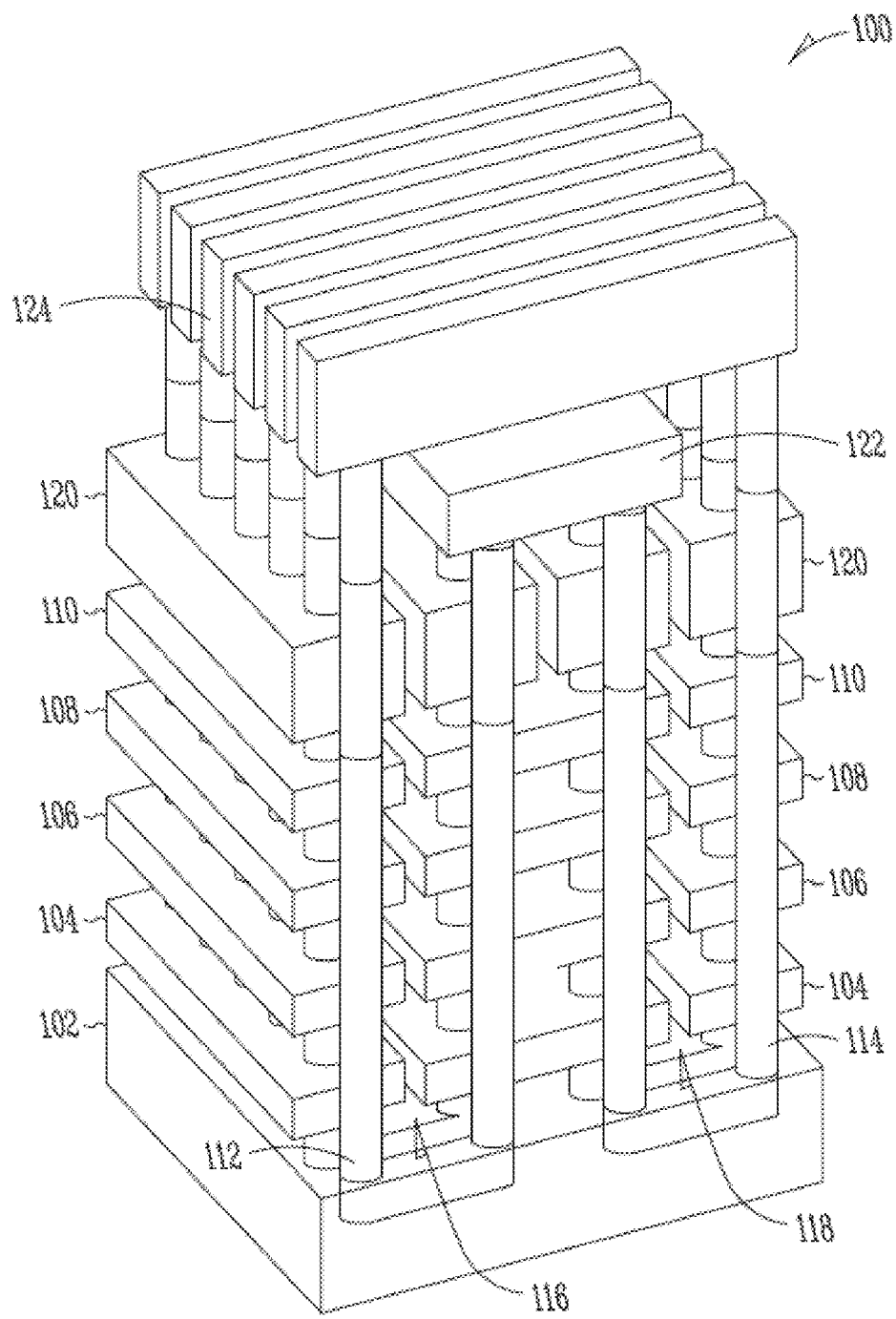
FIG. 1A illustrates an example three-dimensional views of a 3D NAND architecture semiconductor memory device.

Aspects of the present disclosure configure a system component, such as a memory sub-system processor or controller, such as a corrective read unit or module, to perform corrective read (CR) operations in response to determining that a read bit error rate (RBER) associated with a set of memory components transgresses a threshold. In performing the CR operations, the memory sub-system processor or controller charges a first word line (WL) to neutralize charge in a channel and senses a distribution of charges of the first WL. Based on the distribution of charges, the memory sub-system processor or controller can adjust a read trim level associated with sensing charge distribution of a second WL adjacent to the first WL. The memory sub-system processor or controller can then sense the distribution of charges on the second WL without having to first charge the second WL as charges affecting the second WL have already been neutralized when the first WL was charged. Namely, the time between the application of the charge to the first WL and the sensing of the charge on the second WL is sufficiently small to avoid build up of charges or an electrical field on the second WL before the second WL is sensed. Because of this sufficiently small amount of time, there is no need to apply the charge to the second WL before sensing the distribution of charges on the second WL which reduces the amount of time it takes to complete performing the CR operations. This improves the overall efficiency of operating and implementing the memory sub-system.

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random access memory (DRAM), or synchronous dynamic random access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase change random access memory (PCRAM), resistive random access memory (RRAM), or magnetoresistive random access memory (MRAM), among others. Flash memory is utilized as non-volatile memory for a wide range of electronic applications. Flash memory devices typically include one or more groups of one-transistor, floating gate memory cells that allow for high memory densities, high reliability, and low power consumption, and/or replacement-gate (RG) NAND devices.

Two common types of flash memory array architectures include NAND and NOR architectures, named after the logic form in which the basic memory cell configuration of each is arranged. The floating gate memory cells of the memory array are typically arranged in a matrix. The gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a column of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series-coupled group, restricted only by the selected memory cells of each group, placing current-encoded data values of the row of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit, such as 1-bit, 2-bit, or 4-bits). Such cells can be referred to as multi-state memory cells, multi-digit cells, or multi-level cells (MLCs). In certain examples, MLC can refer to a memory cell that can store two bits of data per cell (e.g., one of four programmed states), and a triple-level cell (TLC) can refer to a memory cell that can store three bits of data per cell (e.g., one of eight programmed states). In other examples, MLC can refer to any memory cell that can store more than one bit of data per cell, or can represent one of more than two programmed states.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Memory arrays or devices can be combined together to form a storage volume of a memory system, such as a solid state drive (SSD). An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other electromechanical delay associated with magnetic disk drives. SSDs may also use non-volatile flash memory cells to obviate internal battery supply requirements, thus allowing the drive to be more versatile and compact.

An SSD can include a number of memory devices, including a number of dies or logical units (LUNs). Each die can include a number of memory arrays and peripheral circuitry thereon, and the memory arrays can include a number of blocks of memory cells organized into a number of physical pages. The SSD can receive commands from a host in association with memory operations, such as read or write operations to transfer data (e.g., user data and associated integrity data, such as error data and address data, etc.) between the memory devices and the host, or erase operations to erase data from the memory devices.

In three-dimensional (3D) architecture semiconductor memory technology, as the number of tiers of a memory device increases, such as by stacking vertical structures, the number of physical pages, sub-blocks, or blocks in the memory device will increase. As the number of physical pages, sub-blocks, or blocks increases, the number of string drivers required to drive the memory cells of the memory device will increase. A vertical decoder structure can be configured to reduce the number of string drivers required for a 3D memory structure, while reducing power consumption and, in certain examples, lowering current requirements and reducing the block size for each individual string driver.

There are challenges in efficiently managing or performing media management operations on typical 3D memory devices (e.g., 3D architecture semiconductor memory). Specifically, typical 3D memory devices employ CR operations in case the RBER associated with reading one or more memory components (e.g., blocks or pages) exceeds or transgresses a threshold. As part of the CR operation, the typical 3D memory devices read or sense a charge distribution associated with a first WL of a pillar using a default or first read trim level. Based on the sensed charge distribution (e.g., in relation to an expected charge distribution) using the first read trim level, the typical 3D memory devices adjust the default or first read trim level (e.g., increase the expected read charge for different bits of information) and read or sense the charge distribution of an adjacent second WL using an adjusted first read trim level.

Figure 1B:
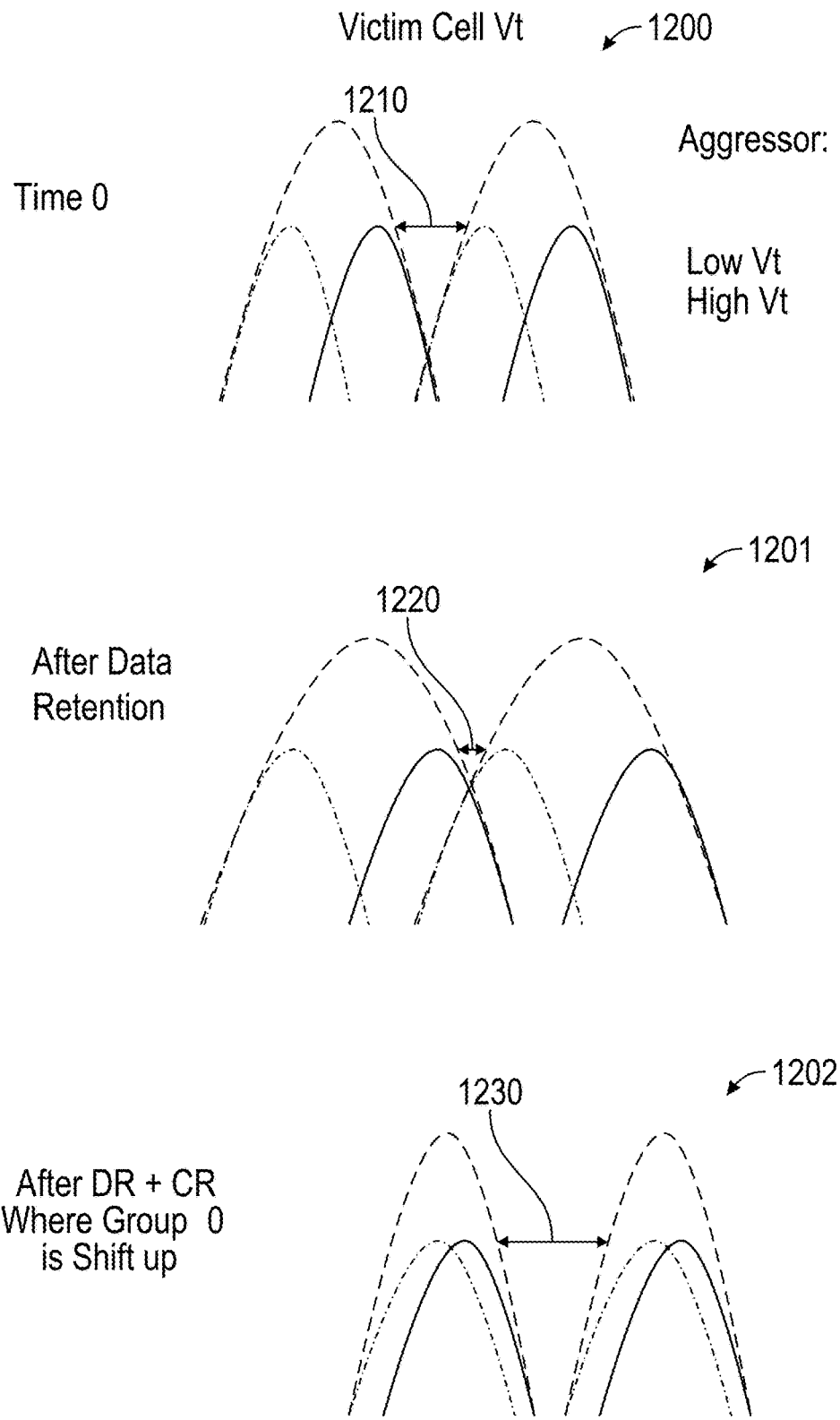
FIG. 1B illustrates threshold voltage (Vt) distribution over time.

For example, as shown in FIG. 1B, diagram 1200 represents that at time 0 (e.g., when a charge distribution is initially stored in a victim cell), the threshold voltage distribution (Vt) 1210 of a victim cell is minimally impacted by the charges stored in an aggressor cell. In this case, the charge distribution can be read from the victim cell using the Vt 1210. After a data retention period (DR), diagram 1201 shows the charge distribution stored by the victim cell is prone to leakage. As a result, charges from the neighboring cell (e.g., the aggressor cell) adversely impact the Vt 1220 of the victim cell. Namely, as shown in FIG. 1B, the Vt 1220 is smaller which increases the bit error rate. This can be related to lateral charge migration if the victim and aggressor cells have difference levels of Vt states. After the CR operation is performed to adjust the read level for the WLn read operation due to the first WLn+1 sensing, as shown in the diagram 1202, the Vt 1230 is shifted up reducing the bit error rate.

In some examples, as part of performing the sensing of the charges on each WL, the typical 3D memory devices first apply a charge or voltage, or charge up the SGS and SGD transistors of the individual WLs. In some examples, as part of performing the sensing of the charges on each WL, the typical 3D memory devices first apply a charge or voltage, or charge up all of the transistors in the NAND strings including the SGS and SGD transistors to neutralize the residue charges in the tunnel dielectric. Specifically, each time the typical 3D memory devices read or sense from an individual WL, the typical 3D memory devices first apply a voltage or charge, or charge up the SGS and SGD of the transistors of the individual WL. The charge or voltage can be applied during any memory read access. The charge or voltage is applied to selected blocks of memory and unselected sub-blocks of memory. For unselected sub-blocks of memory, after reaching a specified vpass threshold, the SGS and SGD of the unselected sub-blocks ramps down to 0. This is done to reduce the effect of an electrical field created by difference in voltage levels stored by adjacent transistors in a channel tunnel dielectric. By charging up the SGS and SGD transistors of the individual WL, charges in the tunnel dielectric are neutralized, which improves the accuracy of sensing charge distributions stored by the individual WL. The need to charge each individual WL prior to performing sensing operations to read the charge distribution is inefficient and increases the amount of time it takes to complete a CR operation.

Aspects of the present disclosure address the above and other deficiencies by providing a corrective read module that performs CR operations in response to determining that a RBER associated with a set of memory components transgresses a threshold. In performing the CR operations, the corrective read module charges a first WL to neutralize charge in a tunnel dielectric and senses a distribution of charges of the first WL. Based on the distribution of charges, the corrective read module can adjust a read trim level associated with sensing charge distribution of a second WL adjacent to the first WL. The corrective read module can then sense the distribution of charges on the second WL without having to first charge the second WL as charges affecting the second WL have already been neutralized when the first WL was charged. Namely, the time between the application of the charge to the first WL and the sensing of the charge on the second WL is sufficiently small to avoid build up of charges or an electrical field on the second WL before the second WL is sensed. Because of this sufficiently small amount of time, there is no need to apply the charge to the second WL before sensing the distribution of charges on the second WL, which reduces the amount of time it takes to complete performing the CR operations. This improves the overall efficiency of operating and implementing the memory sub-system.

In some examples, the memory sub-system includes a set of memory components that include a pillar that includes a tunnel dielectric and a plurality of transistors and a processing device coupled to the set of memory components. The processing device initiates a CR operation on the set of memory components. In response to the CR operation, the processing device applies a charge to a first WL that includes a first transistor of the plurality of transistors to neutralize charges in the tunnel dielectric and senses a charge distribution of a second WL that includes a second transistor of the plurality of transistors adjacent to the first transistor based on the charge applied to the first WL that neutralized the charges in the tunnel dielectric.

In some examples, the processing device determines that a read bit error rate (RBER) associated with the set of memory components transgresses a threshold. The processing device performs the CR operation in response to determining that the RBER transgresses the threshold.

In some examples, the processing device senses a charge distribution of a third WL including a third transistor of the plurality of transistors adjacent to the first transistor based on the charge applied to the first WL that neutralized the charges in the tunnel dielectric. In some examples, the charge distribution of the second WL is sensed without applying a charge to the second WL to neutralize the charges in the tunnel dielectric.

In some examples, the processing device applies the charge to the first WL by performing a vpass operation in which a voltage is applied to each transistor in the memory including a source-side select gate (SGS) and a drain-side select gate (SGD) transistors. In some examples, the processing device applies the charge to the first WL by performing a vpass operation in which a voltage is applied to turn on all of the transistors in the NAND string or pillar including the SGS, SGD, dummy WLs and data WLs. The vpass operation can be performed during any memory read access and is not limited to being performed during a CR operation. The vpass operation takes place in selected blocks of memory and unselected sub-blocks of memory. For unselected sub-blocks of memory, after reaching the vpass threshold, the SGS and SGD of the unselected sub-blocks ramps down to 0. The processing device senses a charge distribution of the first WL in response to applying the charge to the first WL. In some cases, the processing device adjusts a read trim level associated with the second WL based on sensing the charge distribution of the first WL.

The processing device prevents or avoids applying a voltage to a source-side select gate (SGS) and a drain-side select gate (SGD) prior to sensing the charge distribution of the second WL.

In some examples, the pillar comprises a plurality of adjacent memory cells. In some cases, the processing device, after sensing a charge distribution of the first WL in response to applying the charge to the first WL, maintains a charge on the first WL while the charge distribution of a second WL is being sensed.

In some examples, the CR operation includes a 1-bit, 2-bit, or 4-bit CR operation. In some examples, the processing device prevents or avoids hot carrier injection during a read operation associated with the first and second WL based on applying the charge to the first WL.

In some cases, the memory sub-system includes three-dimensional (3D) NAND memory structures. In some cases, the memory sub-system includes replacement-gate (RG) NAND devices.

Though various embodiments are described herein as being implemented with respect to a memory sub-system (e.g., a controller or processor of the memory sub-system), some or all of the portions of an embodiment can be implemented with respect to a host system, such as a software application or an operating system of the host system.

Figure 8:
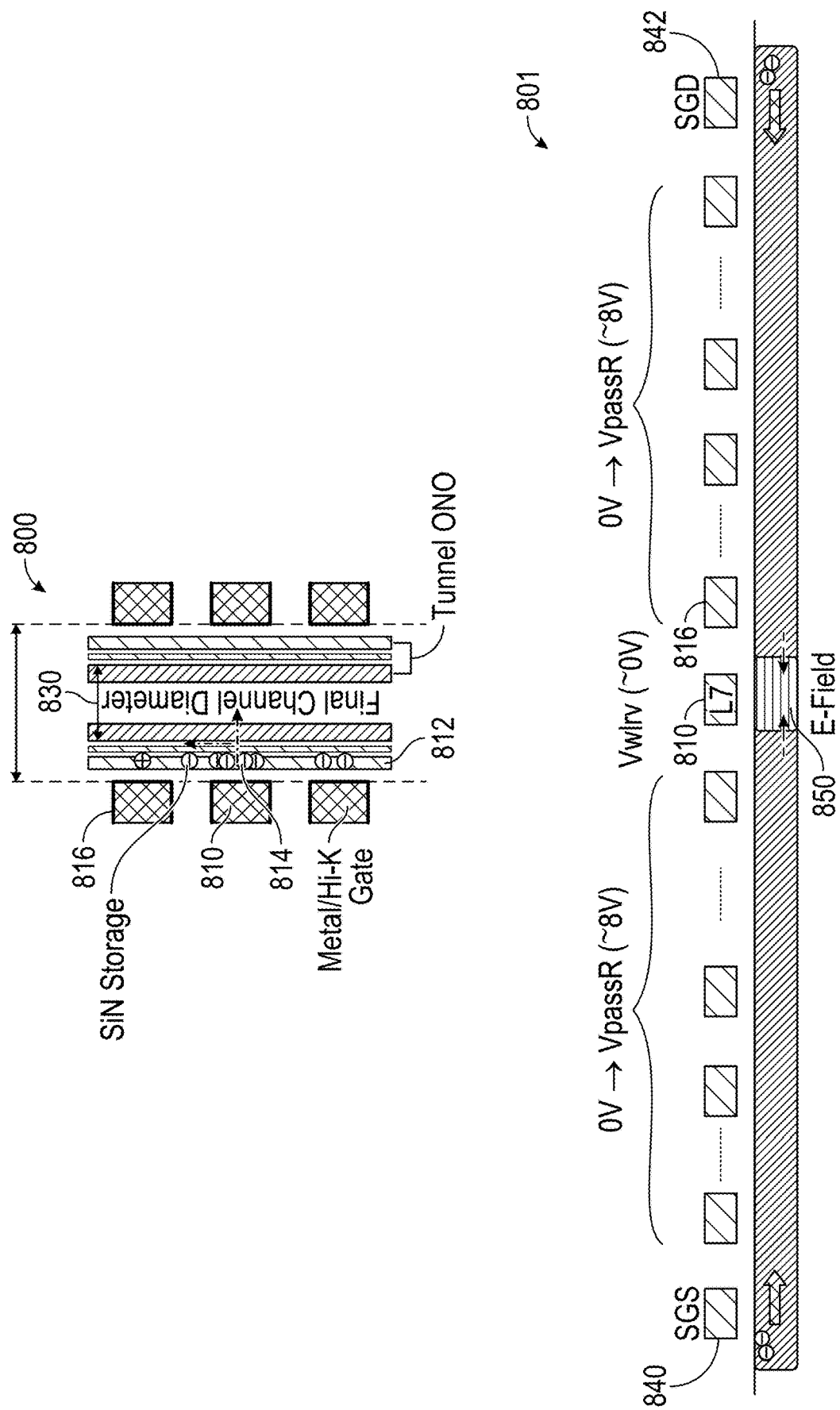
FIG. 8 illustrates example schematic diagrams of cross-sections of a 3D NAND architecture semiconductor memory device, according to some examples.

FIG. 1A illustrates an example 3D view of a 3D NAND architecture semiconductor memory device 100 on a substrate 102 according to various embodiments, depicting functional structures defining the architecture, including access lines (e.g., word lines) 104, 106, 108, 110; U-shaped pillars 112, 114; select gates 120; a source line 122; and data lines (e.g., bit lines) 124. Memory device 100 represents a portion of a greater number of similar structures that would typically be found in a block, device, or other unit of NAND memory. As described later, FIG. 8 shows a cross-section of the 3D NAND architecture in which multiple transistors of a pillar implementing the semiconductor memory device 100 are depicted.

The example memory device 100 includes multiple tiers of memory structures, including first, second, third, and fourth access lines 104, 106, 108, 110 that at least partially surround charge storage structures (e.g., floating gates) of respective pluralities of charge storage transistors (e.g., memory cells), each including a source, a drain, and a control gate. In the memory device 100 illustrated in FIG. 1A, each of the separate first, second, third, and fourth access lines 104, 106, 108, 110 are located at separate tiers of the memory device 100. Although shown with four tiers of access lines in FIG. 1A for purposes of illustration, in various examples in actual devices, the memory device 100 can include a greater number of tiers of access lines, such as 8, 16, 32, 64, etc. In some examples, the charge storage structures of the memory device 100 include replacement-gate (RG) NAND devices.

The memory device 100 can include a plurality of U-shaped pillars that function as channels for the charge storage transistors. Although illustrated as having 12 U-shaped pillars in FIG. 1A for purposes of illustration, including first and second U-shaped pillars 112, 114, the memory device 100 can include more or fewer U-shaped pillars, as desired. Each of the first and second U-shaped pillars 112, 114 can extend into the substrate 102, and can be separated by first or second vertical slots 116, 118, respectively. The first and second U-shaped pillars 112, 114 can include a semiconductor material, such as polysilicon, which in many examples will be formed as a tube (hollow cylinder) of polysilicon defining a central aperture, with a dielectric material filling the aperture.

The memory device 100 can include select transistors formed at each end of the first and second U-shaped pillars 112, 114, and select gates 120 surrounding the select transistors. The source line 122 can be formed on the select transistors at first ends of the first and second U-shaped pillars 112, 114, and the data lines (e.g., bit lines) 124 can be formed on the select transistors at second ends of the first and second U-shaped pillars 112, 114.

In certain examples, one or more of the tiers of semiconductor material can function as a body of a peripheral transistor, such as a decoder transistor, driver, or one or more other peripheral circuits for the memory device 100.

Although illustrated in FIG. 1A using U-shaped pillars 112, 114, the 3D NAND architecture semiconductor memory device 100 can, in other examples, be formed in one or more other shapes of pillars, including substantially vertical (and not U-shaped) pillars having source and data lines at respective first and second ends. Further, in certain examples, the memory device 100 can include multiple vertical structures stacked upon one another, such as illustrated in the commonly assigned U.S. Pat. No. 8,964,474, issued to Midori Morooka et al., and titled "Architecture for 3-D NAND Memory," incorporated by reference herein in its entirety, including its disclosure of stacked arrays of memory cell strings and respective methods of operation.

Figure 2:
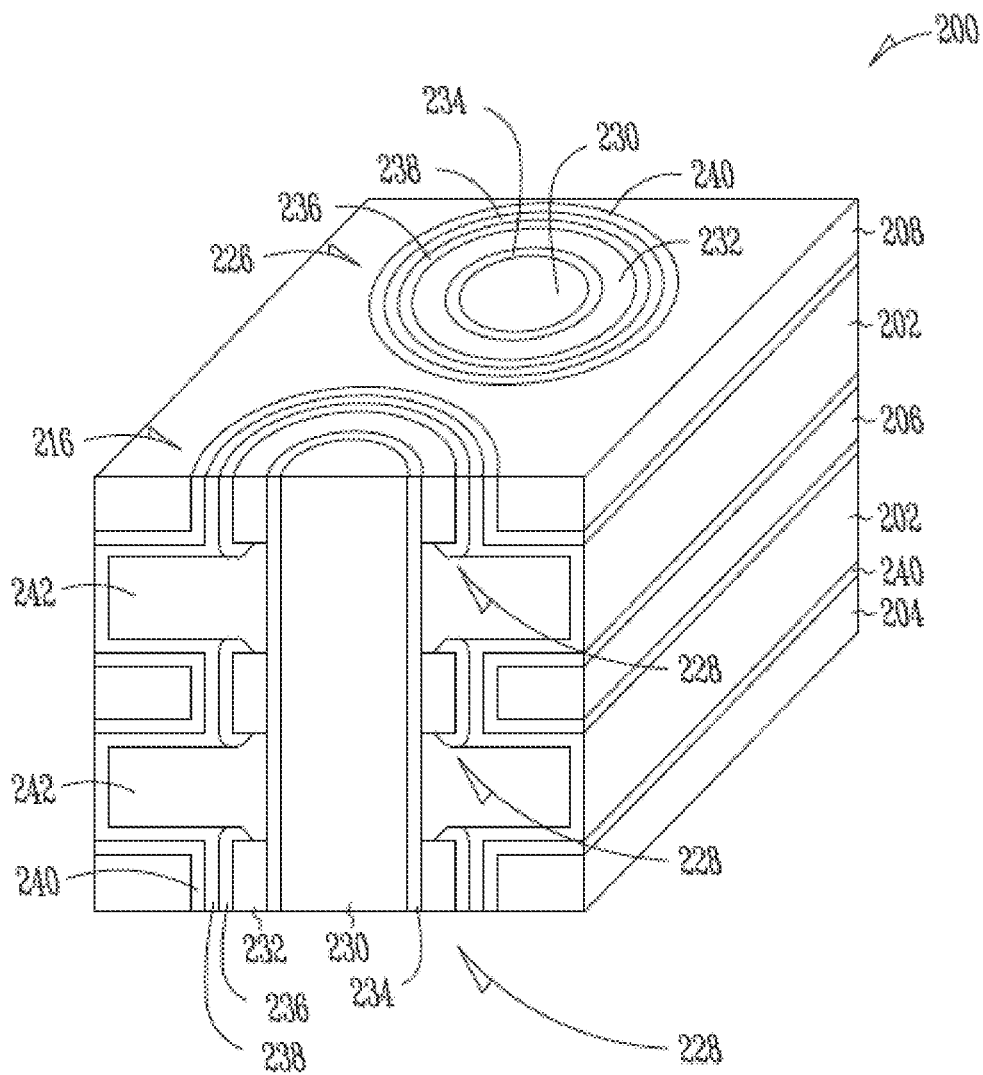
FIG. 2 illustrates an example three-dimensional views of a 3D NAND architecture semiconductor memory device.

FIG. 2 illustrates an example 3D cross section of a 3D NAND architecture semiconductor memory device 200, including portions of second and third pillars (e.g., U-shaped pillars) 216, 226, first, second, and third access lines 202, 204, 206, 208, and memory cells 228.

Each of the second and third pillars 216, 226 includes a conductive structure 230, preferably a semiconductor material, such as polysilicon. In many examples, the polysilicon will define a central aperture, which will typically be filled with a dielectric material. The portions of the second and third pillars 216, 226 illustrated in FIG. 2 include three individual memory cells 228. Each 3D memory cell 228 includes a volume of semiconductor material, such as, in many examples, a partial ring structure 232 (e.g., p+ type polysilicon, etc.) that functions as a floating gate, separated from the polysilicon of the second and third pillars 216, 226 by a tunnel dielectric 234, and from respective first, second, or third access lines 204, 206, 208 by one or more inter-poly dielectric layers, such as an oxide-nitride-oxide (ONO) structure, including, for example, a first silicon dioxide ($SiO_2$) layer 236, a silicon nitride ($Si_3N_4$) layer 238, and a second dioxide layer 240. The respective memory cells 228 are separated from each other by additional tiers of dielectric material 242.

Although the memory cells 228 in FIG. 2 include floating gate storage structures, in other examples, other charge storage mechanisms may be utilized, such as charge trapping structures or other forms of storage structures.

Figure 3:
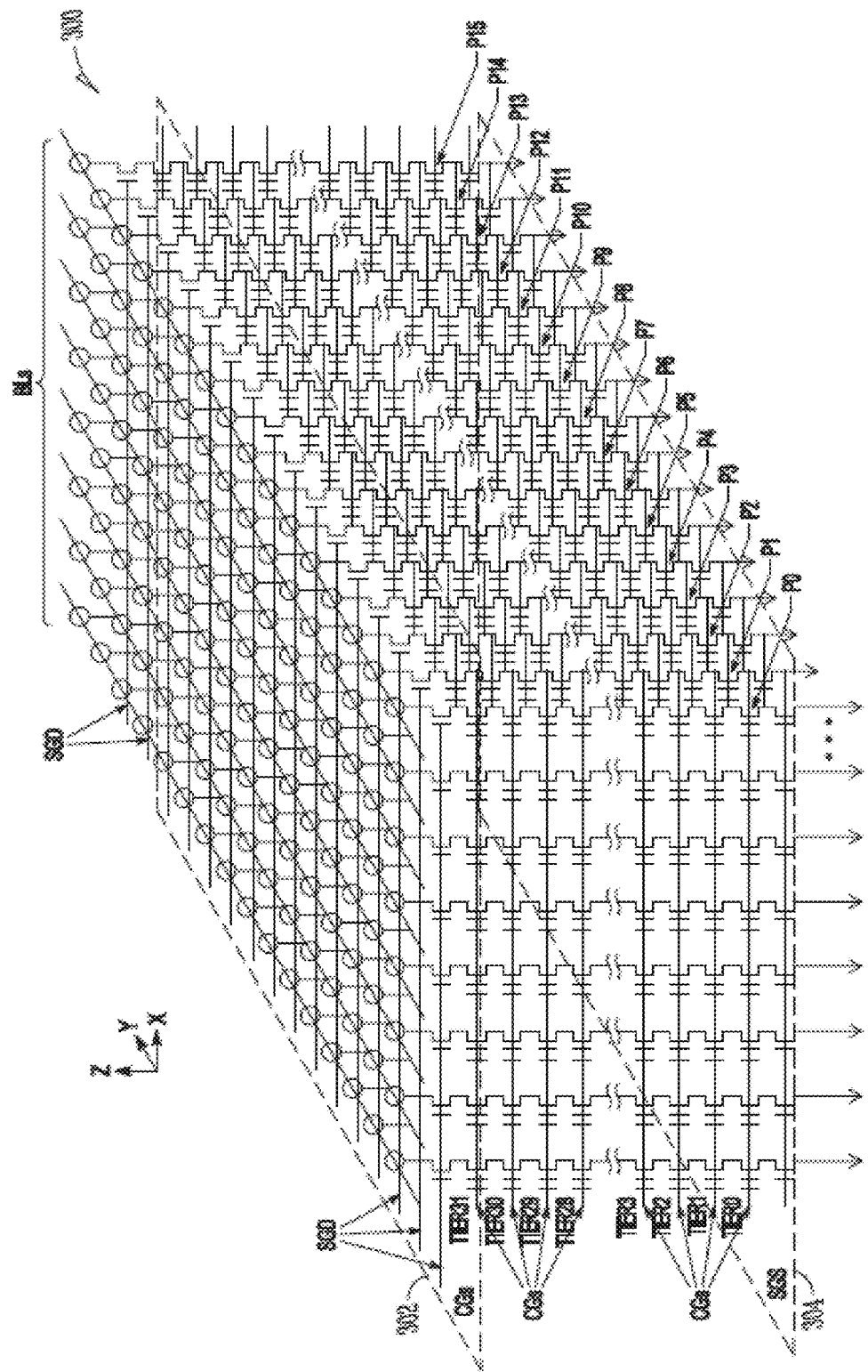
FIGS. 3-4 illustrate example schematic diagrams of a 3D NAND architecture semiconductor memory array.

FIG. 3 illustrates an example schematic diagram of a 3D NAND architecture semiconductor memory array 300 including a plurality of strings of memory cells, each string including 32 tiers (TIER0-TIER31) of charge storage transistors stacked in the Z direction, source to drain, from a source-side select gate (SGS) to a drain-side select gate (SGD). Each string of memory cells in the 3D memory array 300 can be arranged along the Y direction as data lines (e.g., bit lines (BL)), and along the X direction as physical pages (P0-P15). Within a physical page (e.g., P0), each tier represents a row of memory cells, and each string of memory cells represents a column. A block of memory cells can include a number of physical pages (e.g., 128, 384, etc.). In other examples, each string of memory cells can include more or less tiers (e.g., 8, 16, 64, 128, etc.), as well as one or more additional tiers of semiconductor material above or below the charge storage transistors (e.g., select gates, data lines, etc.), as desired.

Each memory cell in the memory array 300 includes a control gate coupled to (e.g., electrically or otherwise operatively connected to) an access line (e.g., word line), which collectively couples the control gates across a specific tier, or a portion of a tier, as desired. Specific tiers in the 3D memory array 300, and accordingly, specific memory cells in a string, can be accessed or controlled using respective access lines. For example, the memory array 300 includes a first level of semiconductor material 302 (e.g., polysilicon, etc.) that couples the control gates of each memory cell in TIER31, and a second level of semiconductor material 304 that couples the source-side select gates (SGS) of the array 300. Similar levels of metal or semiconductor material can couple the control gates for each tier. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 4:
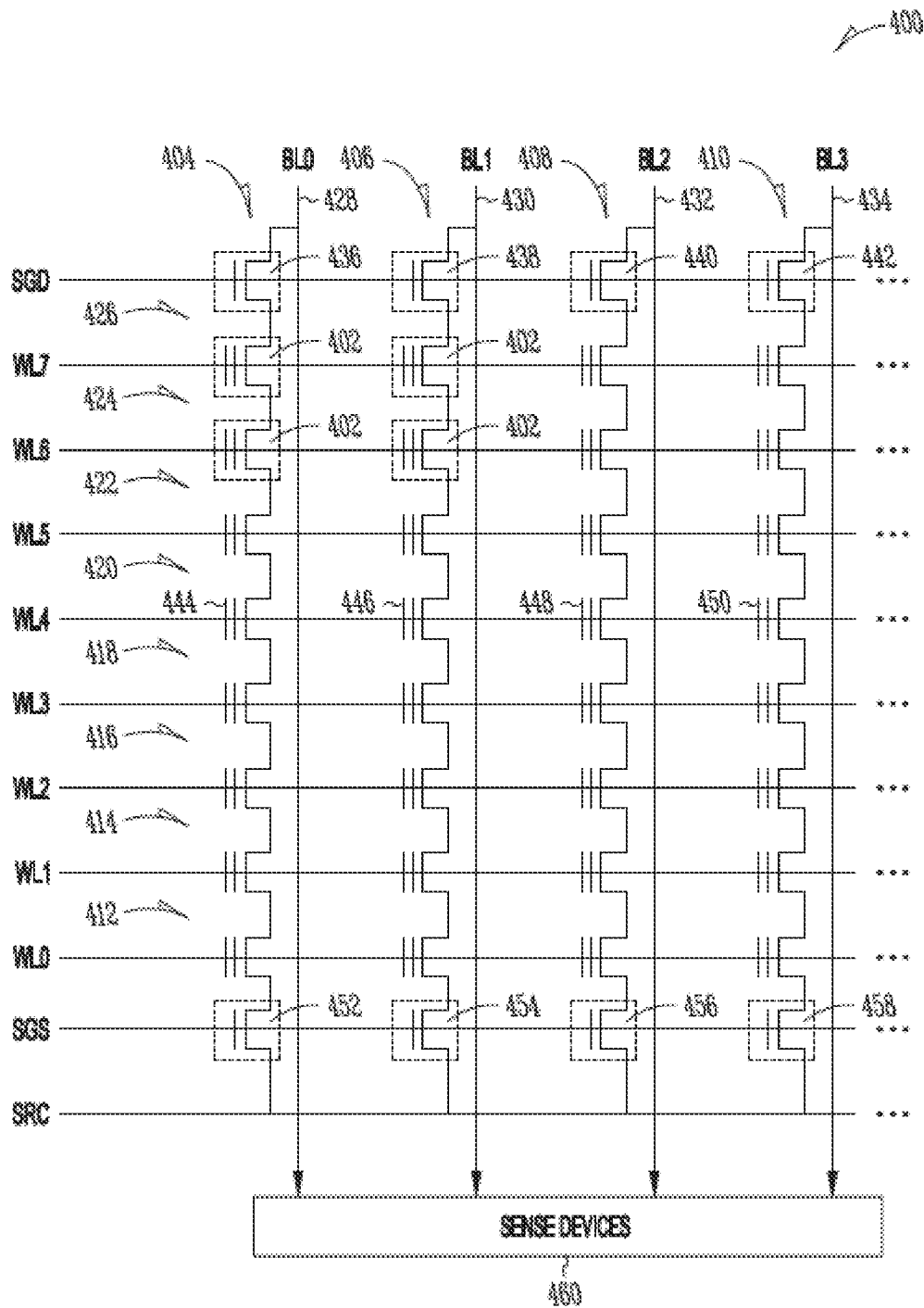

FIG. 4 illustrates an example schematic diagram of a portion of a 3D NAND architecture semiconductor memory array 400 including a plurality of memory cells 402 arranged in a two-dimensional array of strings (e.g., first, second, third, and fourth strings 404-410) and tiers (e.g., TIER0-TIER7 412-426), and sense amplifiers or devices 460. For example, the memory array 400 can illustrate an example schematic diagram of a portion of a physical page of memory cells of a 3D NAND architecture semiconductor memory device. Each string of memory cells is coupled to a source line (SRC) using a respective source-side select gate (SGS) (e.g., first, second, third, or fourth SGS 452-458), and to a respective data line (e.g., first, second, third, or fourth bit lines (BL0-BL3) 428-434) using a respective drain-side select gate (SGD) (e.g., first, second, third, or fourth SGD 436-442). Although illustrated with 8 tiers (TIER0-TIER7 412-426, e.g., using word lines (WL) WL0-WL7) and 4 data lines (BL0-BL3 428-434) in the example of FIG. 4, other examples can include strings of memory cells having more or fewer tiers (e.g., 16, 32, 64, etc.) or data lines, as desired.

In a NAND architecture semiconductor memory array, such as the example memory array 400, the state of a selected memory cell can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL3), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first, second, third, or fourth control gates 444-450 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, such as, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 460, coupled to one or more of the data lines (e.g., first, second, third, or fourth bit lines (BL0-BL3) 428-434), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
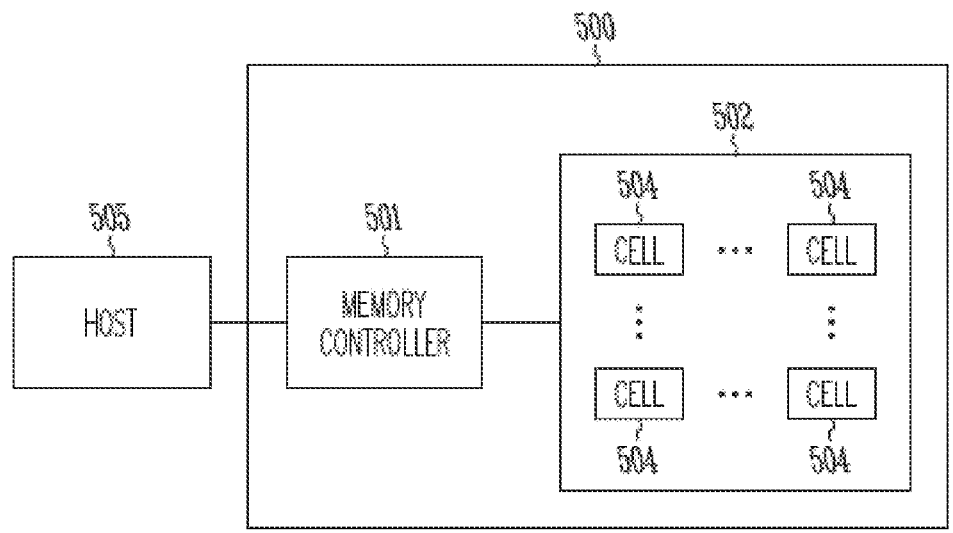
FIG. 5 illustrates an example block diagram of a memory device.

FIG. 5 illustrates an example block diagram of a memory device 500 including a memory controller 501 and a memory array 502 having a plurality of memory cells 504, and a host 505 external to the memory device 500. One or more physical interfaces can be used to transfer data between the memory device 500 and the host 505, such as a serial advanced technology attachment (SATA) interface, a peripheral component interconnect express (PCIe) interface, a universal serial bus (USB) interface, or one or more other physical connectors or interfaces. The host 505 can include a host system, such as a personal computer, a digital camera, a mobile electronic device, a memory card reader, or one or more other electronic devices external to the memory device 500.

The memory controller 501 can receive instructions from the host 505 and can communicate with the memory array 502, such as to transfer data to (e.g., write or erase) or from (e.g., read) one or more of the memory cells 504 of the memory array 502. The memory controller 501 can include, among other things, circuitry or firmware, such as a number of components or integrated circuits. For example, the memory controller 501 can include one or more memory control units, circuits, or components configured to control access across the memory array 502 and to provide a translation layer between the host 505 and the memory device 500. The memory controller 501 can include one or more input/output (I/O) circuits, lines, or interfaces to transfer data to or from the memory array 502.

The memory array 502 (e.g., a 3D NAND architecture semiconductor memory array) can include a number of memory cells 504 arranged in, for example, a number of devices, planes, blocks, or physical pages. As one example, a memory device 500 can include 18,592 bytes (B) of data per page, 1536 pages per block, 548 blocks per plane, and 4 planes per device. Other examples can include other numbers or arrangements.

In operation, data is typically written to or read from the memory device 500 in pages, and erased in blocks. However, one or more memory operations (e.g., read, write, erase, etc.) can be performed on larger or smaller groups of memory cells, as desired. The data transfer size of a memory device is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512B) as well as a number of bytes (e.g., 32B, 54B, 224B, etc.) of metadata corresponding to the user data, such as integrity data (e.g., error detecting or correcting code data), address data (e.g., logical address data, etc.), or other metadata associated with the user data.

Different types of memory cells 504 or memory arrays 502 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 6:
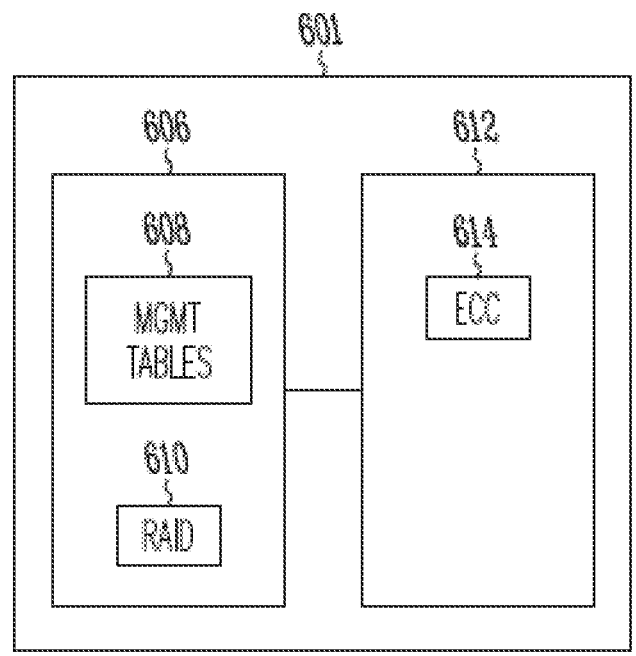
FIG. 6 illustrates an example block diagram of a memory controller.

FIG. 6 illustrates an example block diagram of a memory controller 601 including a memory management component 606 and a memory controller component 612.

The memory management component 606 can include, among other things, circuitry or firmware, such as a number of components or integrated circuits associated with various memory management functions, including wear leveling (e.g., garbage collection or reclamation), error detection or correction, block retirement, or one or more other memory management functions. The memory management component 606 can parse or format host commands (e.g., commands received from a host) into device commands (e.g., commands associated with operation of a memory array, etc.), or generate device commands (e.g., to accomplish various memory management functions) for the memory controller component 612 or one or more other components of a memory device.

The memory management component 606 can include management tables 608 configured to maintain various information associated with one or more component of the memory device (e.g., various information associated with a memory array or one or more memory cells coupled to the memory controller 601). For example, the management tables 608 can include information regarding block age, block erase count, error history, or one or more error counts (e.g., a write operation error count, a read bit error count, a read operation error count, an erase error count, etc.) for one or more blocks of memory cells coupled to the memory controller 601. In certain examples, if the number of detected errors for one or more of the error counts is above a threshold, the bit error can be referred to as an uncorrectable bit error. The management tables 608 can maintain a count of correctable or uncorrectable bit errors, among other things.

The memory management component 606 can include a redundant array of independent disks (RAID) unit 610 (the term "disks" is a carryover from prior implementations using hard disk drives, and does not require that the RAID unit 610 include a physical disk). The RAID unit 610 can provide data reliability through, among other things, redundant memory operations.

The memory controller component 612 can include, among other things, circuitry or components configured to control memory operations associated with writing data to, reading data from, or erasing one or more memory cells of a memory device coupled to the memory controller 601. The memory operations can be based on, for example, host commands received from a host, or internally generated by the memory management component 606 or the memory controller component 612 (e.g., in association with wear leveling, error detection or correction, etc.).

The memory controller component 612 can include an error correction code (ECC) component 614, which can include, among other things, an ECC engine or other circuitry configured to detect or correct errors associated with writing data to or reading data from one or more memory cells of a memory device coupled to the memory controller 601. The memory controller 601 can be configured to actively detect and recover from error occurrences (e.g., bit errors, operation errors, etc.) associated with various operations or storage of data, while maintaining integrity of the data transferred between a host and a memory device, or maintaining integrity of stored data (e.g., using redundant RAID storage in the RAID unit 610, etc.), and can remove (e.g., retire) failing memory resources (e.g., memory cells, memory arrays, pages, blocks, etc.) to prevent future errors.

Figure 7:
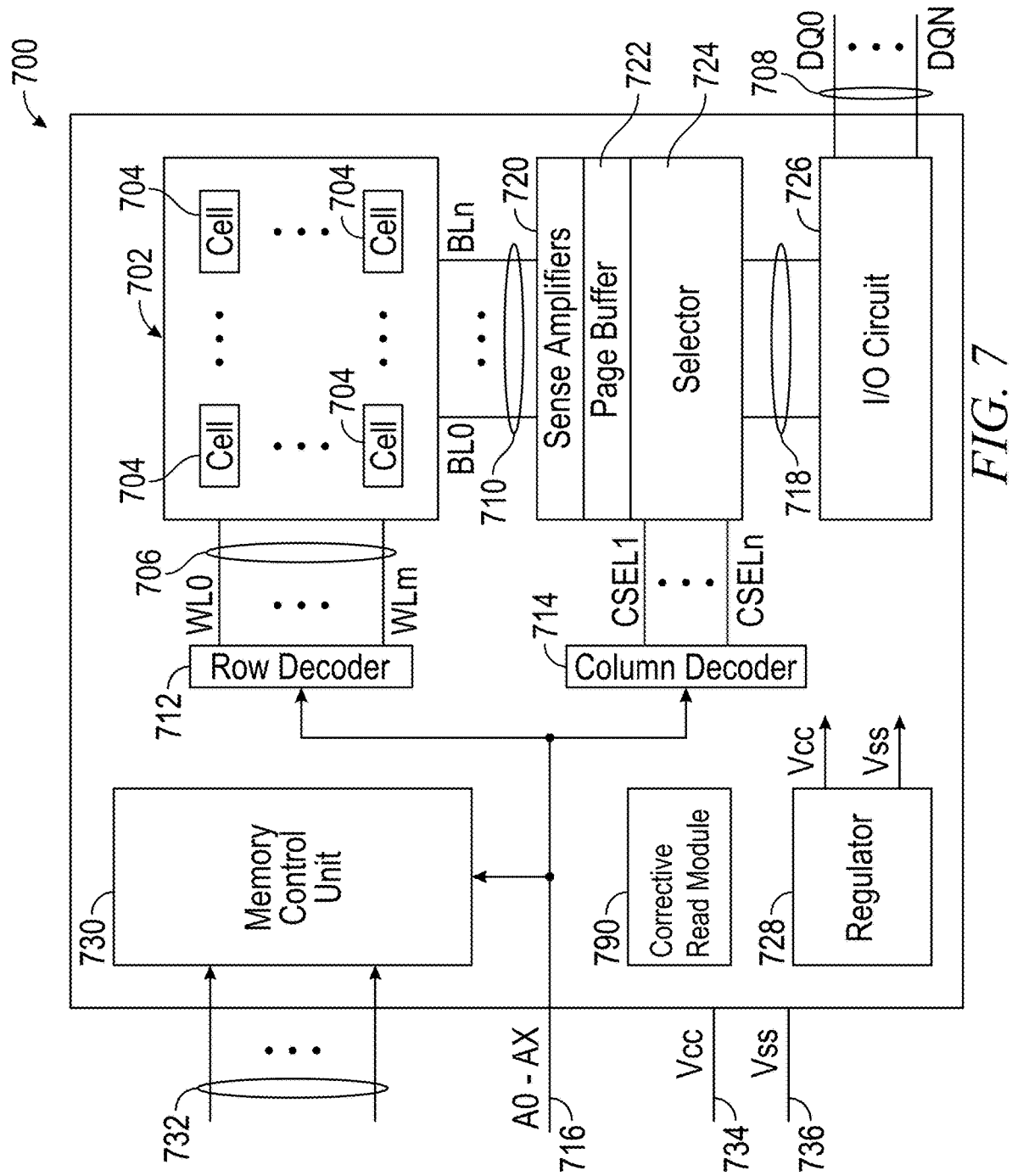
FIG. 7 illustrates an example block diagram of a memory device, according to some examples.

FIG. 7 illustrates an example block diagram of a memory device 700 including a memory array 702 having a plurality of memory cells 704, and one or more circuits or components to provide communication with, or perform one or more memory operations on, the memory array 702. The memory device 700 can include a row decoder 712, a column decoder 714, sense amplifiers 720, a page buffer 722, a selector 724, an input/output (I/O) circuit 726, a corrective read module 790, and a memory control unit 730. In some cases, the corrective read module 790 can be part of the memory control unit 730 or any other component shown in FIG. 7. The memory cells 704 of the memory array 702 can be arranged in rows, columns, pages, and blocks, and can be accessed using, for example, access lines 706, first data lines 710, or one or more select gates, etc.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (A0-AX) received on an address line 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (A0-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells, one or more of the sense amplifiers 720 can read a logic level in the selected memory cell in response to a read current flowing in the memory array through the selected string to the data lines 710. In some cases, the read current is compared to a read trim value or level and based on whether the read current exceeds or transgresses the read trim value, the corresponding logic level can be determined.

One or more devices external to the memory device 700 can communicate with the memory device 700 using the I/O lines (DQ0-DQN) 708, address lines 716 (A0-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (A0-AX) into one or more column address signals (CSEL1-CSELn). The selector 724 (e.g., a select circuit) can receive the column select signals and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

In some cases, the corrective read module 790 can be a separate physical component from the components of the memory device 700. In some cases, the corrective read module 790 and the components of the memory device 700 are implemented by the same physical device or integrated circuit. The corrective read module 790 can be coupled to the memory control unit 730 (and/or the ECC component 614) to determine a RBER of a portion of memory and to determine whether the RBER of the portion of memory transgresses a threshold. The corrective read module 790 can perform CR operations in response to determining that the RBER of the portion of memory transgresses a threshold.

Depending on the embodiment, the corrective read module 790 can comprise logic (e.g., a set of transitory or non-transitory machine instructions, such as firmware) or one or more components that causes the corrective read module 790 to perform operations described herein. The corrective read module 790 can comprise a tangible or non-tangible unit capable of performing operations described herein.

The corrective read module 790 can charge a first WL (e.g., WL6 of FIG. 4) to neutralize charge in a tunnel dielectric or tunnel dielectric layer (e.g., tunnel dielectric 234 of FIG. 2), such as by applying a current or voltage to the SGS and/or the SGD of the first WL and/or to all of the WLs in the pillar or NAND string such that all of the NAND transistors are turned ON. Then, the corrective read module 790 senses a distribution of charges of the first WL. Based on the distribution of charges, the corrective read module 790 can adjust a read trim level associated with sensing charge distribution of a second WL (e.g., WL5 or WL7 of FIG. 4) adjacent to the first WL (WL6). The corrective read module 790 can then sense the distribution of charges on the second WL without having to first charge the second WL (including applying the voltage or charge to the SGS and/or SGD during a CR operation of the second WL) as charges affecting the second WL have already been neutralized when the first WL was charged. Namely, the time between the application of the charge to the first WL and the sensing of the charge on the second WL is sufficiently small to avoid build up of charges or an electrical field on the second WL before the second WL is sensed. Because of this sufficiently small amount of time, there is no need to apply the charge to the second WL before sensing the distribution of charges on the second WL, which reduces the amount of time it takes to complete performing the CR operations. This improves the overall efficiency of operating and implementing the memory sub-system.

In this way, the corrective read module 790 can complete performing CR operations on the memory device 700 in less time than typical devices to improve the efficiency of operation of the memory sub-system.

FIG. 8 illustrates example schematic diagrams 800 and 801 of cross-sections of a 3D NAND architecture semiconductor memory device, according to some examples. Specifically, the cross-section of the diagram 800 shown in FIG. 8 represents a typical 3D NAND architecture and is a magnified or blown-up version of NAND architecture semiconductor memory device 200 shown in FIG. 2. The pillar 830 can correspond to one of the pillars 112, 114 shown in FIG. 1A.

As shown in diagram 800, the 3D NAND architecture includes a pillar 830, a set of WL including a first WL 816 and a second WL 810, a SiN or other dielectric material, such as an ONO tunnel 812 or channel. As previously discussed, each of the set of WLs includes a transistor that includes a gate. In some examples, after some period of retention time of charge distributions being stored by the transistors of the pillar, charges can build up in the tunnel dielectric which creates an electric field in certain WLs. For example, the tunnel dielectric portion under first WL 816 can store a relatively high charge (e.g., 8V) and the tunnel dielectric portion under adjacent second WL 810 can store a relative low charge (e.g., 2V). As a result of the potential difference, an electric field can be formed that disrupts accurate reading of the charges stored by floating gates of the first WL 816 and/or the second WL 810.

Specifically, as shown in diagram 801, the electric field 850 can be formed and built up on the second WL 810 based on the difference in charge stored by the first WL 816. This can adversely impact read sensing of the stored charges. To address this issue, typical systems apply voltages or charges to the SGS 840 and/or the SGD 842 prior to sensing the charge distribution of a given WL during normal read operations and during CR operations. The application of the voltages or charges to the SGS 840 and/or the SGD 842 causes any built up charges to neutralize in the ONO tunnel 812 or channel, such as the charges 814.

Figure 9A:
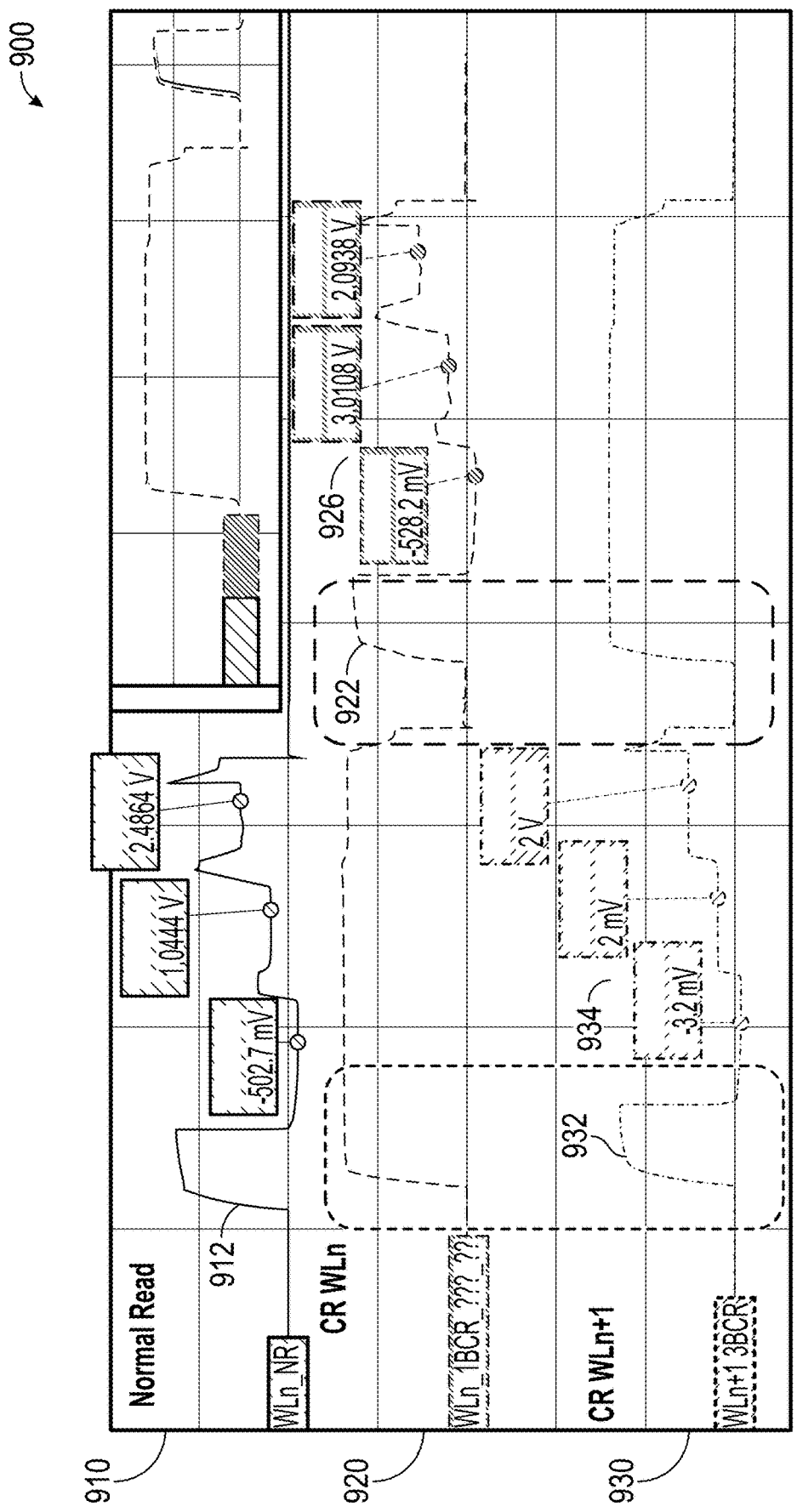
FIGS. 9A-9B illustrate example timing diagrams of corrective read operations, according to some examples.
Figure 9B:
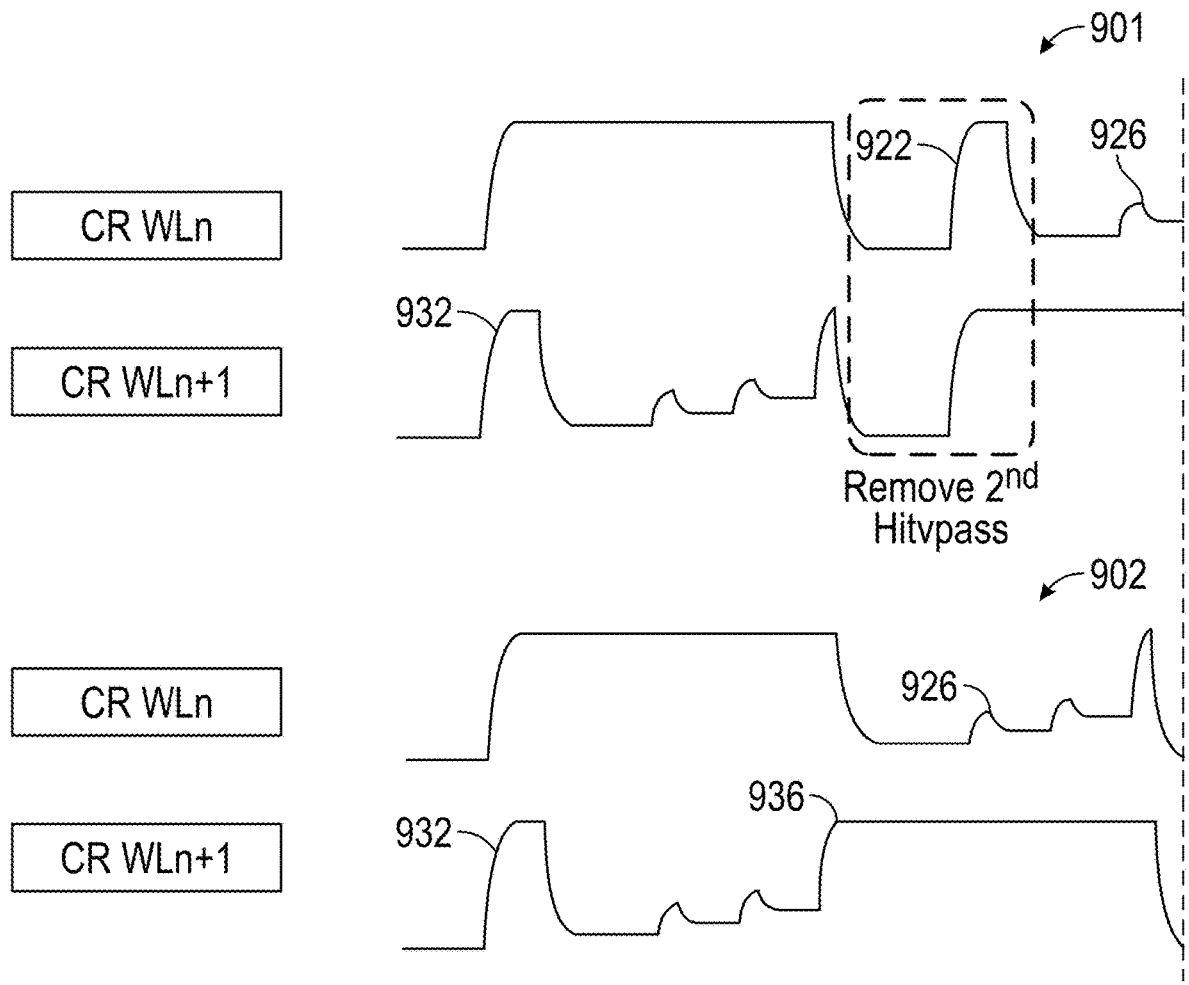

FIGS. 9A-9B illustrate example timing diagrams 900, 901, and 902 of corrective read operations, according to some examples. For example, the timing diagram 910 in diagram 900 represents some of the operations performed for read sensing data or charges stored in the transistors of the pillar 830. Specifically, initially the corrective read module 790 applies a voltage 912 to the SGS 840 and/or the SGD 842 of an individual WL and/or to all of the WLs and all of the transistors in the NAND. This neutralizes charges that may have leaked in the ONO tunnel 812 or channel, such as the charges 814. Thereafter, the corrective read module 790 can read or sense a set of charge distributions and compare the sensed charges against a read trim level to determine the logical value that is stored.

Similarly, when performing CR operations, as shown in diagram 930, the corrective read module 790 selects a first WL (e.g., $WL_{n+1}$) (also referred to as an aggressor WL) to sense the charge distribution stored by the transistors in the first WL. Once the first WL is selected, the corrective read module 790 applies a voltage 932 (e.g., a vpass signal or hitvpass signal) to the SGS 840 and/or the SGD 842 of the first WL and/or to all of the transistors in all of the WLs. Thereafter, the corrective read module 790 reads or senses a set of charge distributions 934 and compares the charge distribution against a read trim level to determine the logical value that is stored. After the charge distributions are compared with the read trim level, the corrective read module 790 adjusts the read trim level (increases or decreases the read trim level) prior to reading or sensing charges stored in an adjacent WL. After the read trim level is adjusted, as shown in diagram 920, the corrective read module 790 selects a second WL (e.g., $WL_n$) (also referred to as the victim WL) that is adjacent to the first WL to sense the charge distribution stored by the transistors in the second WL. Once the second WL is selected, the corrective read module 790 again applies a voltage 922 to the SGS 840 and/or the SGD 842 of the second WL. Thereafter, the corrective read module 790 reads or obtains a set of charge distributions 926 and compares the charge distribution against a read trim level to determine the logical value that is stored. This process continues until the corrective read module 790 senses or reads all of the WLs of the pillar 830.

During a CR operation, the corrective read module 790 reads each of the WLs in sequence one after the other with minimal delay. As a result, the amount of time available for charges to leak from one transistor of the pillar 830 to another is limited. This amount of time is usually insufficient to allow enough charges to leak and form an electric field that adversely impacts sensing of the charges stored in the WLs. As such, in some examples, rather than re-applying the charge or voltage to the SGS 840 and/or the SGD 842 before read sensing the charges stored in the transistors each time, the corrective read module 790 applies the charge or voltage to the SGS 840 and/or the SGD 842 only once. This is sufficient to neutralize any charges or holes that have leaked into the ONO tunnel 812 or channel and can increase the efficiencies of performing CR operations.

Specifically, as shown in FIG. 9B, the timing diagram 901 corresponding to a portion of the timing diagrams 920 and 930 is modified to remove the re-application of the voltage or charges to the SGS 840 and/or the SGD 842 after such a voltage or charge is applied to an adjacent WL. In such cases, as shown by the timing diagram 902, the corrective read module 790 selects a first WL (e.g., $WL_{n+1}$) to sense the charge distribution stored by the transistors in the first WL. Once selected, the corrective read module 790 applies a voltage 932 (e.g., a vpass signal or hitvpass signal) to the SGS 840 and/or the SGD 842 of the first WL. Thereafter, the corrective read module 790 reads or senses a set of charge distributions 934.

After the charge distributions are compared with the read trim level, the corrective read module 790 adjusts the read trim level (increases or decreases the read trim level) prior to reading or sensing charges stored in an adjacent WL, such as the second WL. After the read trim level is adjusted, the corrective read module 790 selects the second WL (e.g., $WL_n$) that is adjacent to the first WL to sense the charge distribution stored by the transistors in the second WL. The corrective read module 790 maintains the voltage 932 at a particular charge level 936 while immediately reading or sensing the charge distribution 926 stored in the transistors of the second WL. To do so, the corrective read module 790 removes application of the voltage signal to the SGS 840 and/or the SGD 842 of the second WL and senses or reads the charges stored by the transistors in the second WL. This is performed without first charging up the SGS 840 and/or the SGD 842 of the second WL which increases the speed and efficiency at which the CR operation is performed.

In some cases, after the read trim level is adjusted based on reading the first WL, the corrective read module 790 selects a third WL (e.g., $WL_{n+2}$) that is adjacent to the first WL to sense the charge distribution stored by the transistors in the third WL. The corrective read module 790 maintains the voltage 932 at a particular charge level 936 while immediately reading or sensing the charge distribution 926 stored in the transistors of the third WL. To do so, the corrective read module 790 removes application of the voltage signal to the SGS 840 and/or the SGD 842 of the third WL and senses or reads the charges stored by the transistors in the third WL. This can take place after or before reading the charge distribution stored in the second WL. This is performed without first charging up the SGS 840 and/or the SGD 842 of the third WL which increases the speed and efficiency at which the CR operation is performed.

In this way, the application of the voltage or charge to the SGS 840 and/or the SGD 842 of the first WL enables the corrective read module 790 to accurately sense the charge distribution stored in at least two adjacent WLs (e.g., $WL_n$ and $WL_{n+2}$) without initially charging up the SGS 840 and/or the SGD 842 of the at least two adjacent WLs.

In some examples, the corrective read module 790 performs a first read on the aggressor WL (e.g., WLn+1) and then performs a second read on a victim WL (e.g., WLn) in which the read level adjustment for the victim WL is performed based on the reading of the aggressor WL. This is referred to as a one-sided CR. For a two-sided CR, the corrective read module 790 can first perform a read operation on a first aggressor WL (e.g., WLn+1). Then, the corrective read module 790 performs a second read on a second aggressor (e.g., WLn−1). Finally, the corrective read module 790 performs a last read on a victim WL (e.g., WLn). In this case, the vpass operation can be skipped for the second and third read operations since the transistors were all turned on when the first read operation was performed on the first aggressor WL in which all of the tunnel dielectric charges were neutralized. The sequence of the first and second aggressor read scan also be swapped. The read level adjustment of the victim WL can be performed based on the two prior reads of the first and second aggressor WLs.

Figure 10:
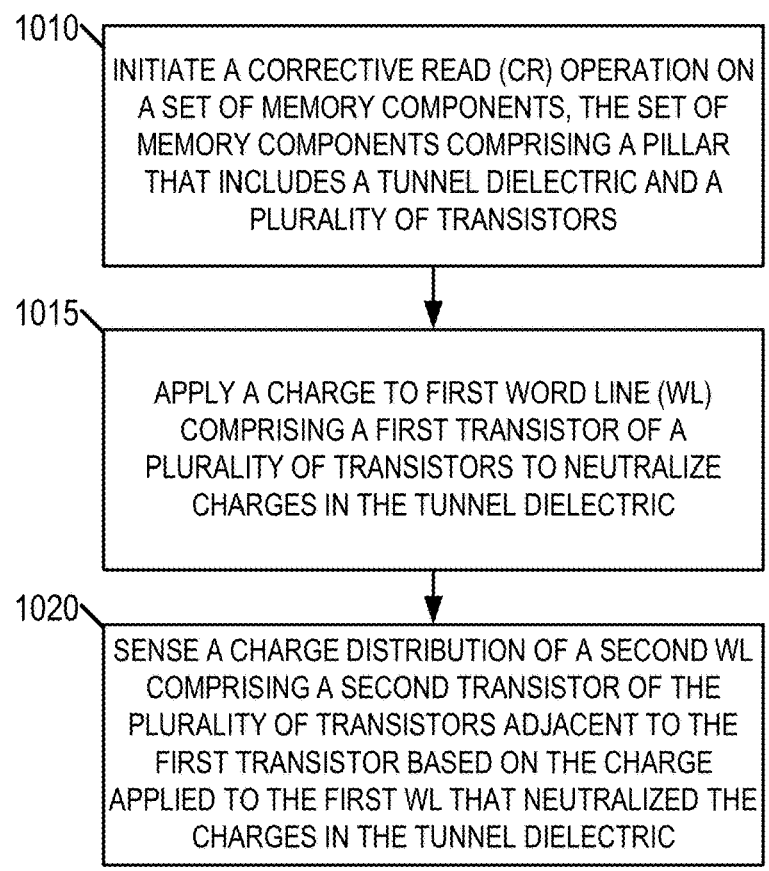
FIG. 10 is a flow diagram of an example method to perform fast corrective read operations, in accordance with some implementations of the present disclosure.

FIG. 10 is a flow diagram of an example method 1000 to perform fast CR operations, in accordance with some implementations of the present disclosure. The method 1000 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 1000 is performed by the corrective read module 790. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 10, the method (or process) 1000 begins at operation 1010, with a corrective read module 790 initiating a corrective read (CR) operation on a set of memory components, the set of memory components comprising a pillar that includes a tunnel dielectric and a plurality of transistors. In such cases, at operation 1015, the corrective read module 790, in response to the CR operation, applies a charge to first WL comprising a first transistor of a plurality of transistors to neutralize charges in the tunnel dielectric. Then, at operation 1020, the corrective read module 790 senses a charge distribution of a second WL comprising a second transistor of the plurality of transistors adjacent to the first transistor based on the charge applied to the first WL that neutralized the charges in the tunnel dielectric.

In view of the disclosure above, various examples are set forth below. It should be noted that one or more features of an example, taken in isolation or combination, should be considered within the disclosure of this application.

Example 1: a system comprising: a memory sub-system comprising a set of memory components, the set of memory components comprising a pillar that includes a tunnel dielectric and a plurality of transistors; and a processing device coupled to the set of memory components and configured to perform operations comprising: initiating a corrective read (CR) operation on the set of memory components; in response to the CR operation, applying a charge to a first word line (WL) comprising a first transistor of the plurality of transistors to neutralize charges in the tunnel dielectric; and sensing a charge distribution of a second WL comprising a second transistor of the plurality of transistors adjacent to the first transistor based on the charge applied to the first WL that neutralized the charges in the tunnel dielectric.

Example 2: the system of Example 1, comprising: determining that a read bit error rate (RBER) associated with the set of memory components transgresses a threshold, wherein the CR operation is performed in response to determining that the RBER transgresses the threshold.

Example 3: the system of any one of Examples 1-2, wherein the operations comprise: sensing a charge distribution of a third WL comprising a third transistor of the plurality of transistors adjacent to the first transistor based on the charge applied to the first WL that neutralized the charges in the tunnel dielectric.

Example 4: the system of any one of Examples 1-3, wherein the charge distribution of the second WL is sensed without applying a charge to the second WL to neutralize the charges in the tunnel dielectric.

Example 5: the system of any one of Examples 1-4, wherein applying the charge to the first WL comprises performing a vpass operation in which a voltage is applied to a source-side select gate (SGS) and a drain-side select gate (SGD).

Example 6: the system of Example 5, wherein the operations comprise: sensing a charge distribution of the first WL in response to applying the charge to the first WL.

Example 7: the system of any one of Examples 1-6, wherein the operations comprise: adjusting a read trim level associated with the second WL based on sensing the charge distribution of the first WL.

Example 8: the system of any one of Examples 1-7, wherein the operations comprise: preventing application of a voltage to a source-side select gate (SGS) and a drain-side select gate (SGD) prior to sensing the charge distribution of the second WL.

Example 9: the system of any one of Examples 1-8, wherein the pillar comprises a plurality of adjacent memory cells.

Example 10: the system of any one of Examples 1-9, wherein the operations comprise: after sensing a charge distribution of the first WL in response to applying the charge to the first WL, maintaining a charge on the first WL while the charge distribution of a second WL is being sensed.

Example 11: the system of any one of Examples 1-10, wherein the CR operation comprises a 1-bit, 2-bit, or 4-bit CR operation.

Example 12: the system of any one of Examples 1-11, wherein the operations comprise: preventing hot carrier injection during a read operation associated with the first and second WL based on applying the charge to the first WL.

Example 13: the system of any one of Examples 1-12, wherein the memory sub-system comprises three-dimensional (3D) NAND memory structures.

Example 14: the system of any one of Examples 1-13, wherein the memory sub-system comprises replacement-gate (RG) NAND devices.

Methods and computer-readable storage medium with instructions for performing any one of the above Examples.

Figure 11:
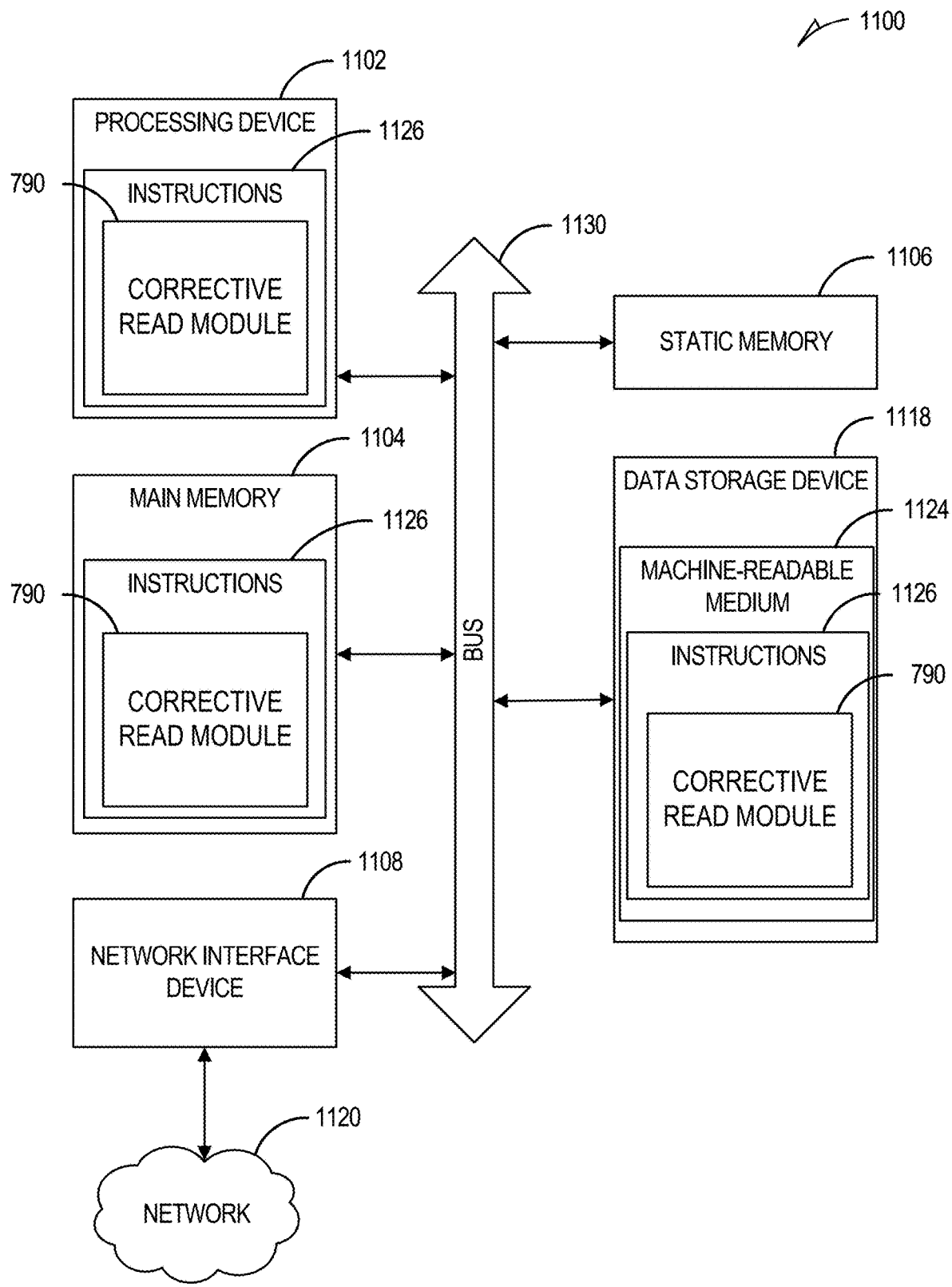
FIG. 11 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 11 illustrates an example machine in the form of a computer system 1100 within which a set of instructions can be executed for causing the machine to perform any one or more of the methodologies discussed herein. In some embodiments, the computer system 1100 can correspond to a host system (e.g., the host 505 of FIG. 5) that includes, is coupled to, or utilizes a memory sub-system (e.g., the 3D NAND architecture semiconductor memory device 100 of FIG. 1A) or can be used to perform the operations of a controller (e.g., to execute an operating system to perform operations corresponding to the corrective read module 790 of FIG. 7). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130.

The processing device 1102 represents one or more general-purpose processing devices such as a microprocessor, a central processing unit, or the like. More particularly, the processing device 1102 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 1102 can also be one or more special-purpose processing devices such as an application specific integrated circuit (ASIC), a field programmable gate array (FPGA), a digital signal processor (DSP), a network processor, or the like. The processing device 1102 is configured to execute instructions 1126 for performing the operations and steps discussed herein. The computer system 1100 can further include a network interface device 1108 to communicate over a network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the 3D NAND architecture semiconductor memory device 100 of FIG. 1A.

In one embodiment, the instructions 1126 implement functionality corresponding to the corrective read module 790. While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

The above detailed description includes references to the accompanying drawings, which form a part of the detailed description. The drawings show, by way of illustration, specific embodiments in which the inventive subject matter can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends linearly relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (e.g., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, sensing charge distribution, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the inventive subject matter should be determined with reference to the appended claims, along with the full scope of equivalents to which such claims are entitled.

What is claimed is:

1. An apparatus comprising:
   a memory sub-system comprising a set of memory components, the set of memory components comprising a pillar that includes a tunnel dielectric and a plurality of transistors; and
   a processing device coupled to the set of memory components and configured to perform operations comprising:
   initiating a corrective read (CR) operation on the set of memory components;
   in response to the CR operation, applying a charge to a first word line (WL) comprising a first transistor of the plurality of transistors to neutralize charges in the tunnel dielectric; and
   sensing a charge distribution of a second WL comprising a second transistor of the plurality of transistors adjacent to the first transistor based on the charge applied to the first WL that neutralized the charges in the tunnel dielectric.

2. The apparatus of claim 1, comprising:
   determining that a read bit error rate (RBER) associated with the set of memory components transgresses a threshold, wherein the CR operation is performed in response to determining that the RBER transgresses the threshold.

3. The apparatus of claim 1, wherein the operations comprise:
   sensing a charge distribution of a third WL comprising a third transistor of the plurality of transistors adjacent to the first transistor based on the charge applied to the first WL that neutralized the charges in the tunnel dielectric.

4. The apparatus of claim 1, wherein the charge distribution of the second WL is sensed without applying a charge to the second WL to neutralize the charges in the tunnel dielectric.

5. The apparatus of claim 1, wherein applying the charge to the first WL comprises performing a vpass operation in which a voltage is applied to all WLs of the set of memory components including a source-side select gate (SGS) and a drain-side select gate (SGD).

6. The apparatus of claim 5, wherein the operations comprise:
   sensing a charge distribution of the first WL in response to applying the charge to the first WL.

7. The apparatus of claim 6, wherein the operations comprise:
   adjusting a read trim level associated with the second WL based on sensing the charge distribution of the first WL.

8. The apparatus of claim 1, wherein the operations comprise:
   preventing application of a voltage to a source-side select gate (SGS) and a drain-side select gate (SGD) prior to sensing the charge distribution of the second WL.

9. The apparatus of claim 1, wherein the pillar comprises a plurality of adjacent memory cells.

10. The apparatus of claim 1, wherein the operations comprise:
    after sensing a charge distribution of the first WL in response to applying the charge to the first WL, maintaining a charge on the first WL while the charge distribution of the second WL is being sensed.

11. The apparatus of claim 1, wherein the CR operation comprises a 1-bit, 2-bit, or 4-bit CR operation.

12. The apparatus of claim 1, wherein the operations comprise:
    preventing hot carrier injection during a read operation associated with the first and second WL based on applying the charge to the first WL.

13. The apparatus of claim 1, wherein the memory sub-system comprises three-dimensional (3D) NAND memory structures.

14. The apparatus of claim 1, wherein the memory sub-system comprises replacement-gate (RG) NAND devices.

15. A method comprising:
    initiating a corrective read (CR) operation on a set of memory components, the set of memory components comprising a pillar that includes a tunnel dielectric and a plurality of transistors;
    in response to the CR operation, applying a charge to a first word line (WL) comprising a first transistor of a plurality of transistors to neutralize charges in the tunnel dielectric; and
    sensing a charge distribution of a second WL comprising a second transistor of the plurality of transistors adjacent to the first transistor based on the charge applied to the first WL that neutralized the charges in the tunnel dielectric.

16. The method of claim 15, comprising:
    determining that a read bit error rate (RBER) associated with the set of memory components transgresses a threshold, wherein the CR operation is performed in response to determining that the RBER transgresses the threshold.

17. The method of claim 15, comprising:
    sensing a charge distribution of a third WL comprising a third transistor of the plurality of transistors adjacent to the first transistor based on the charge applied to the first WL that neutralized the charges in the tunnel dielectric.

18. The method of claim 15, wherein the charge distribution of the second WL is sensed without applying a charge to the second WL to neutralize the charges in the tunnel dielectric.

19. The method of claim 15, wherein applying the charge to the first WL comprises performing a vpass operation in which a voltage is applied to all WLs of the set of memory components including a source-side select gate (SGS) and a drain-side select gate (SGD).

20. A non-transitory computer-readable storage medium comprising instructions that, when executed by a processing device, cause the processing device to perform operations comprising:
    initiating a corrective read (CR) operation on a set of memory components, the set of memory components comprising a pillar that includes a tunnel dielectric and a plurality of transistors;
    in response to the CR operation, applying a charge to a first word line (WL) comprising a first transistor of a plurality of transistors to neutralize charges in the tunnel dielectric; and
    sensing a charge distribution of a second WL comprising a second transistor of the plurality of transistors adjacent to the first transistor based on the charge applied to the first WL that neutralized the charges in the tunnel dielectric.

* * * * *